United States Patent

Tap

[15] 3,646,823

[45] Mar. 7, 1972

[54] FINE TUNE MECHANISM

[72] Inventor: Henry H. Tap, Cary, Ill.

[73] Assignee: Oak Electro/Netics Corp.

[22] Filed: Oct. 12, 1970

[21] Appl. No.: 79,963

[52] U.S. Cl. ....................74/10.45, 74/10.54

[51] Int. Cl. ....................F16h 35/18

[58] Field of Search ....................74/10.41, 10.45, 10.5, 10.54, 74/10.6, 10.8, 10

[56] References Cited

UNITED STATES PATENTS 3,415,128 12/1968 Smart....................74/10.54 X

*Primary Examiner*—Milton Kaufman

*Attorney*—Hofgren, Wegner, Allen, Stellman & McCord

[57] ABSTRACT

A multiple-channel VHF television tuner with memory or preset fine tuning. A channel selector shaft provides for the connection of the circuits of the desired channel and to position a fine tuning member for the selected channel at an adjustment position. The fine tuning members are rotatably mounted on the carrier fixed to the shaft and each has a gear head for engagement with a gear drive from the fine tuning control. An idler gear which interconnects the fine tuning control with the channel adjustment screws is mounted on a carrier plate which is slidable on the front plate of the tuner chassis. A spring urges the slider to bring the gears into engagement. When the channel selector shaft is turned, the slider is moved to disengage the gears and is latched in an inoperative position so that the settings of the fine tuning members are not disturbed during channel changes. The latch is released by a cam on the fine tuning control and the slider moves the idler gear into engagement for tuning adjustment.

21 Claims, 10 Drawing Figures

INVENTOR
Henry H. Tap
BY Hofgren, Wegner, Allen, Stellman & McCord
ATTORNEYS

FINE TUNE MECHANISM

This invention relates to a multiple-channel tuner with an improved mechanical drive mechanism for preset fine tuning elements.

A commonly used multiple-channel tuner, as the VHF tuner for a television receiver, has independent fine tuning members for each of the channels, which may be adjusted independently to tune each channel. A variety of different mechanisms have been utilized for adjusting the individual tuning elements. In an early form of tuner, a fine tuning tool laterally offset from the channel selector shaft was pushed to engage the tuning element and then turned to make the adjustment. Subsequently, mechanisms were developed which permitted location of the fine tuning control concentric with the channel selector shaft but still required a two-step operation of push and turn to adjust the tuning. Examples are shown in Poskozim U.S. Pat. No. 2,981,838 and Cappelle et al. U.S. Pat. No. 3,065,642.

Cross et al. U.S. Pat. No. 3,022,674 shows a mechanism utilizing a control offset from the channel selector which, when turned, performs the dual function of engaging a drive and adjusting the tuning element.

Most popular in the recent years have been tuners of the type illustrated in Ma U.S. Pat. No. 3,244,012 in which a movable slider carries an idler gear which is moved into engagement with the fine tuning element when the fine tuning control is turned. The mechanism, however, requires a friction clutch connection between the fine tuning member and the slider, and the carrier is caused to move each time the fine tuning control is turned. Wear and metal fatigue limit the practical life of such a mechanism.

The present invention is concerned with an improved tuner in which the fine tuning control remains in engagement so long as the tuner is set for the same channel. When the channel selector shaft is turned to select a different channel, the fine tuning control is disengaged and held by a latch in a position out of engagement. Subsequent operation of the fine tuning control releases the latch and reengages the mechanical drive to the fine tuning element.

One feature of the invention is that the adjustment mechanism for the fine tuning member includes a fine tuning control which is rotatable on the channel selector shaft and which has a drive gear. An idler gear is connected between the drive gear and a gear portion of the selected fine tuning member. A movable mounting means for the idler gear has a first position with the idler in engagement and a second position with the idler out of engagement. A spring holds the mounting means in the first position. Further means respond to rotation of the channel selector to move the mounting to the second position, avoiding engagement of the idler gear with the fine tuning members during channel selection.

Another feature of the invention is that the idler gear mounting means or carrier is latched in the second position during channel selection and the latch is released by operation of the fine tuning control.

A further feature is that one spring is utilized to position the idler gear carrier and to perform the latching function.

And another feature is that the latch takes the form of a crank pivoted on the idler gear carrier and engageable with a stop on the tuner chassis.

Still a further feature is that a pointed cam follower cooperates with a cam on the fine tuning control to release the idler gear carrier for movement of the gear into engagement, the pointed configuration preventing a hang-up of the cam follower and latch on the cam.

Further features and advantages will readily be apparent from the following specification and from the drawings, in which.

Figure 8:
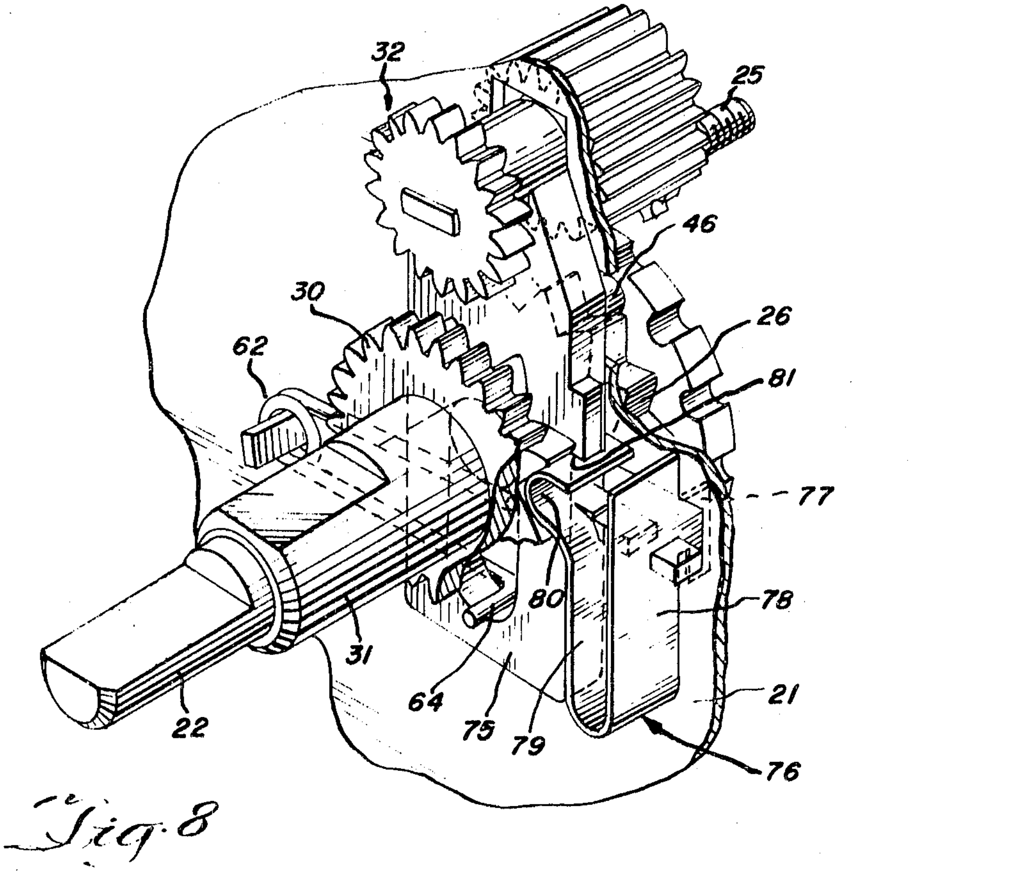
Figure 2:
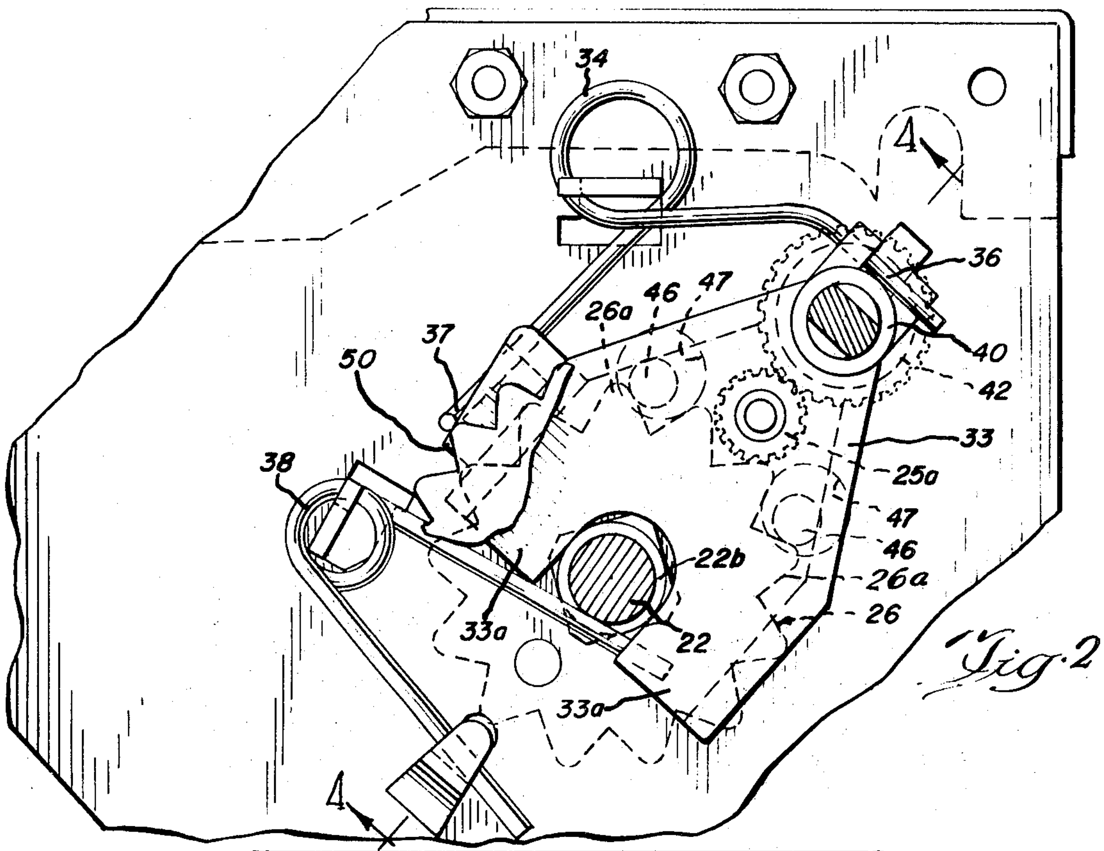
FIG. 2 is a fragmentary section taken generally along line 2—2 of FIG. 4, which portions broken away, and showing the idler gear in engagement.
Figure 3:
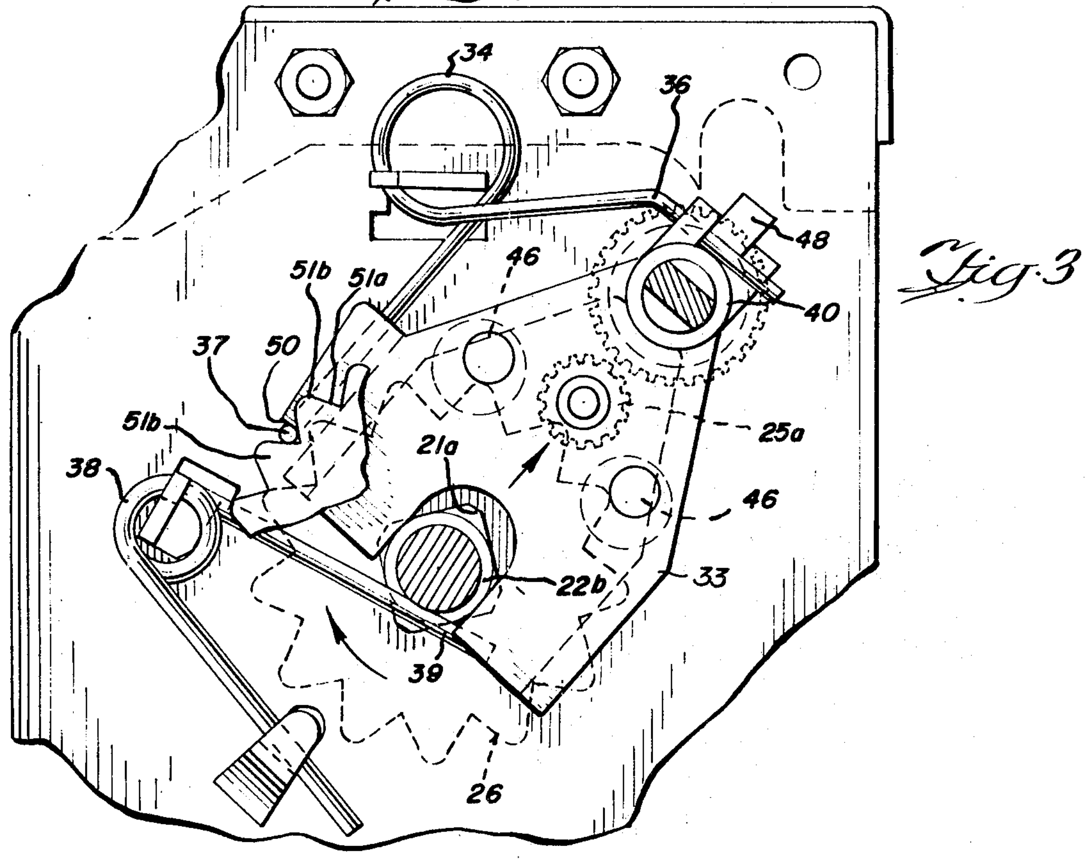
Figures 2A, 3A, 4, 5:
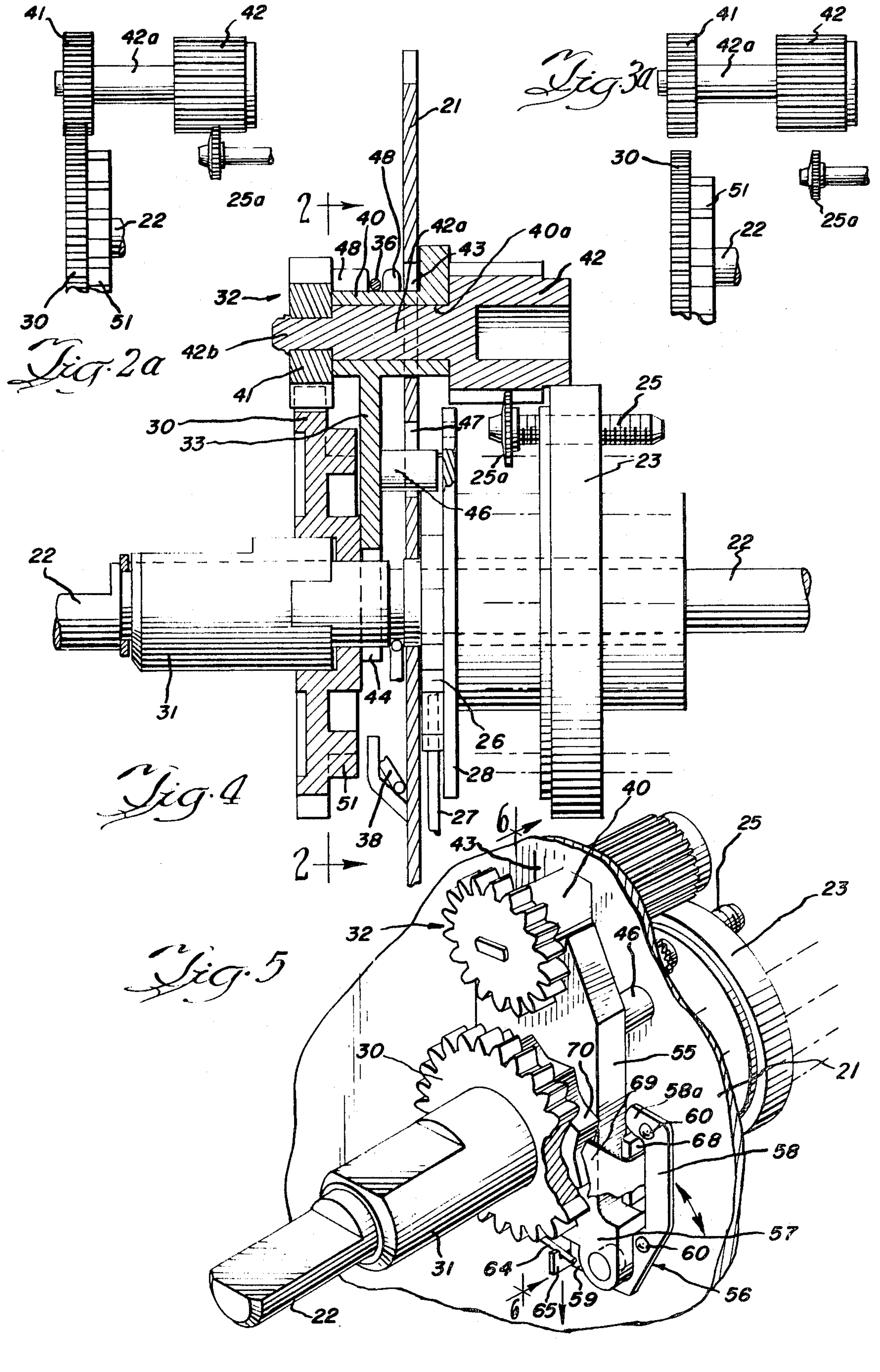
Figure 6:
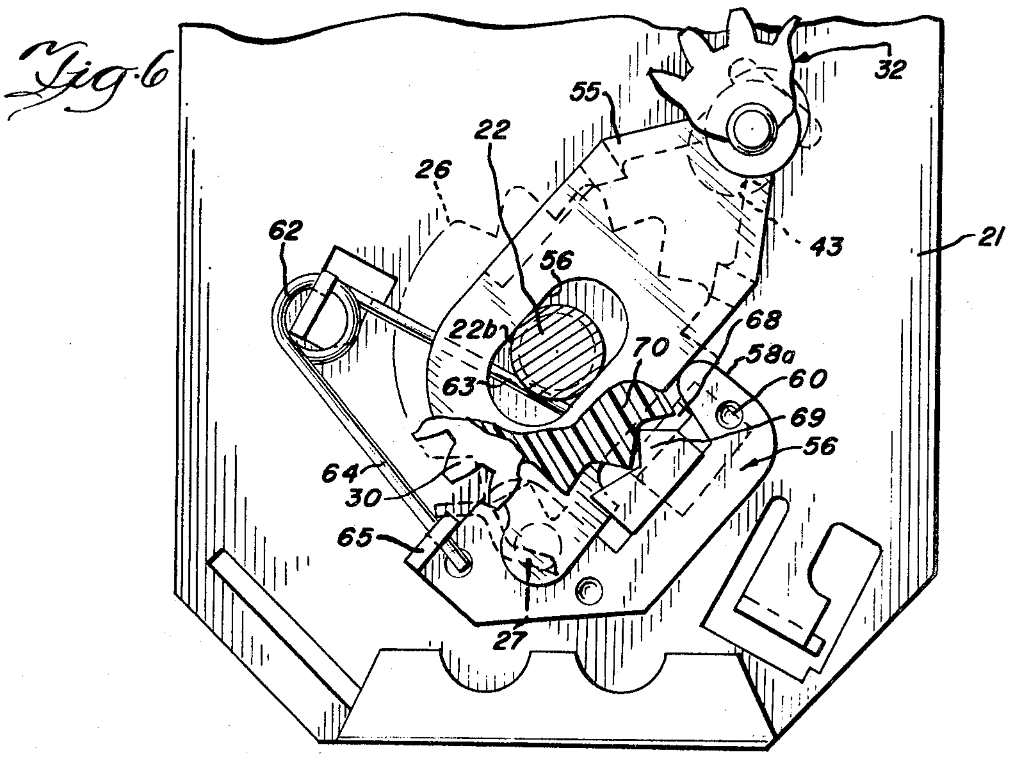
Figure 7:
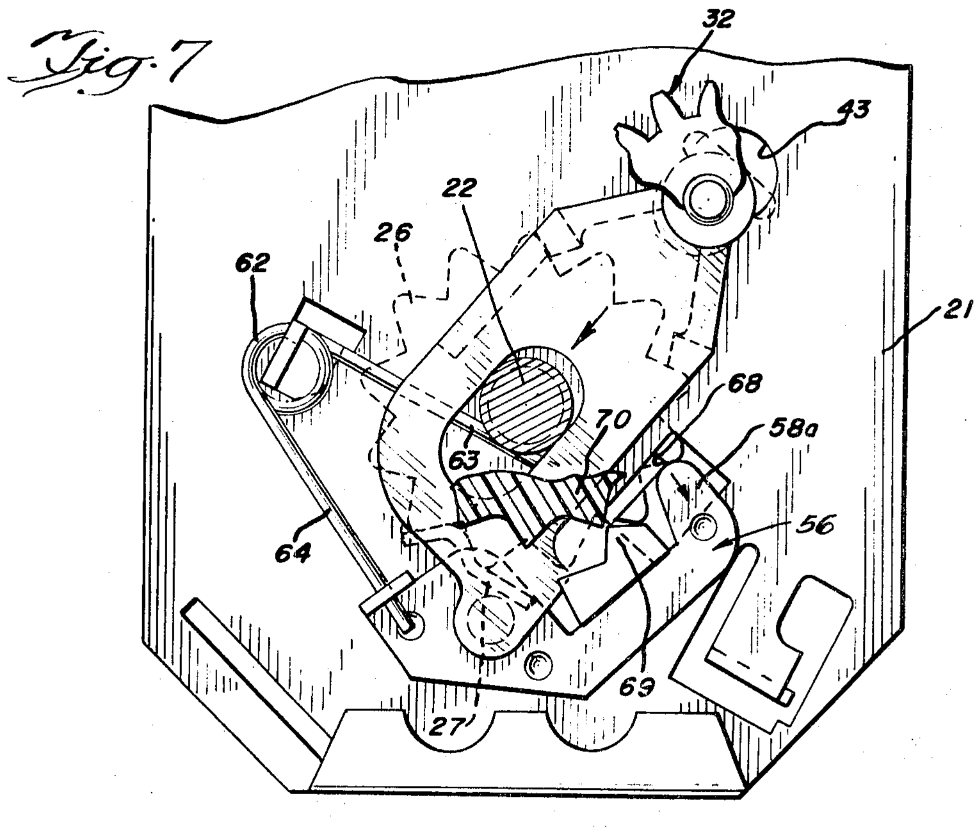

FIG. 2*a* is a diagrammatic illustration of the gears in FIG. 2;

FIG. 3 is a fragmentary sectional view similar to FIG. 2 showing the idler gear out of engagement;

FIG. 3*a* is a diagrammatic illustration of the gears in FIG. 3;

FIG. 4 is a fragmentary longitudinal section through the tuner, generally along line 4—4 of FIG. 2;

FIG. 5 is a fragmentary perspective of a preferred form of the invention;

FIG. 6 is a fragmentary section taken generally along line 6—6 of FIG. 5, showing the idler gear out of engagement;

FIG. 7 is a fragmentary section similar to FIG. 6 showing the idler gear in engagement; and FIG. 8 is a fragmentary perspective of another embodiment of the invention.

The invention is illustrated in this application in a tuner using the oscillator coil carrier and fine tuning screws of Ma U.S. Pat. No. 3,210,485. The mechanism is, however, readily applicable to a turret tuner or to a tuner with a common fine tuning impedance as shown in Cappelle et al. U.S. Pat. No. 3,065,642.

Figure 1:
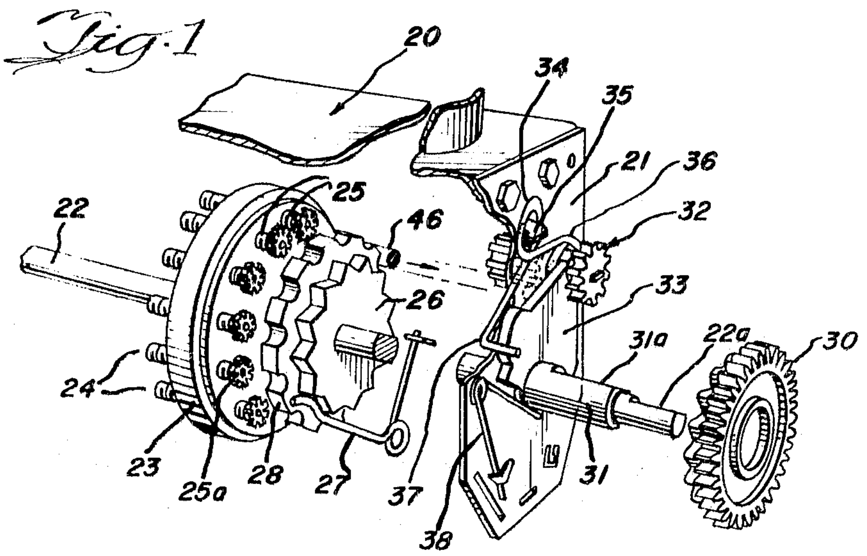
FIG. 1 is a fragmentary diagrammatic exploded view of a tuner incorporating the invention.

The general concept of the invention and the basic operation of the mechanism of FIGS. 1–4 may be seen in FIG. 1. The tuner has a chassis 20 with a front plate 21. Channel selector shaft 22 extends the length of the tuner and projects outwardly through the front plate. A rotary carrier 23 for the oscillator coils 24 and fine tuning screws 25 is mounted on channel selector shaft 22 and turns with it. The fine tuning screws are threaded to the support 23 for adjustment to the appropriate position with respect to the related oscillator coil. The remaining tuner circuitry (which may include a series of switches operated by channel selector shaft 22) is not shown as it forms no part of the present invention.

A detent mechanism establishes the various channel selecting positions of shaft 22. A detent wheel 26, mounted on shaft 22 immediately to the rear of front plate 21 has a serrated periphery which cooperates with the end of detent spring 27 to position the shaft in any one of a plurality of positions. The detent spring is mounted on the rear face of front plate 21 and is of the form illustrated in Cappelle et al. U.S. Pat. No. 3,489,029. A stop plate 28 between the detent plate 26 and fine tuning screw carrier 23 prevents screws 25 being withdrawn from the carrier. A flat **22*a* on the end of shaft 22** provides for mounting a channel selector knob, not shown.

The fine tuning control includes a drive gear 30 mounted on a short shaft section 31 telescoped over and rotatable on the channel selector shaft 22. A flat **31*a* receives a fine tuning knob, not shown. Fine tuning drive gear 30 is connected through an idler gear 32 with the selected fine tuning screw 25. The head of each of the fine tuning screws is formed with gear teeth 25*a*** to mesh with the idler gear.

The idler gear 32 is carried by a mounting plate 33 which is slidable on the front plate 21 of the chassis between a first position (FIG. 2) with the gears in engagement and a second position (FIG. 3) with the gears out of engagement. A spring 34, mounted on a tab 35 extending from the front plate 21 has one end portion 36 which bears against slider 33 and urges it toward the first position. The other end 37 of the spring bears against the lateral edge of the slider and, as will appear, serves to latch it in the second position.

A shaft bias spring 38 holds the selector shaft firmly in opening **21*a* in the front plate 21, and has one end 39 seated in a groove 22*b* in the shaft, positioning the shaft longitudinally on the chassis. The idler gear mounting plate 33 has at its upper end a cylindrical boss 40 having an opening 40*a* extending therethrough axially of the tuner and in which the idler gear 32 is mounted. The idler gear includes a first gear portion 41 for engagement with fine tuning drive gear 30 and a second gear portion 42 for engagement with the gear head 25*a* of a fine tuning screw 25. Gear portion 42 has a cylindrical stem 42*a* which extends through the cylindrical bearing 40 and terminates in a rectangular mounting portion 42*b* on which gear 41** is received.

Cylindrical boss 40 is received in an elongated slot 43 in front plate 21 and slider 33 has a slot 44 at its lower end defining two legs 33*a* which straddle channel selector shaft 22. The engaging surfaces of boss 40 with opening 43 and of legs 33*a* with shaft 22 position and guide the slider in its movement on the front plate.

A pair of bosses 46 extend rearwardly from slider 33 through elongated openings 47 in the front plate, for engagement with the periphery of detent wheel 26.

The operation of the mechanism will be described with particular reference to FIGS. 2 and 3. In FIG. 2, slider 33 is held in its first or operative position by spring 34. The end portion 36 of the spring bears against cylindrical boss 40 and is positioned on the boss by ears 48 urging the slider toward the first position, holding idler gear portion 42 in engagement with the head 25*a* of the tuning screw and idler gear portion 41 in engagement with fine tuning drive gear 30. Rotation of the fine tuning gear 30 drives the idler gear 32 to adjust the fine tuning screw.

When channel selector shaft 22 is operated to select a different channel, a tooth 26*a* of detent wheel 26 engages one of the bosses 46 projecting from the rear of the slider, moving the slider upwardly against spring 34 and disengaging idler gear 32 from fine tuning drive gear 30 and from the gear head 25*a* on the tuning screw. Thus, as carrier 23 rotates with channel selector shaft 22, the positions of the tuning screws with respect to the carrier are not disturbed.

When slider 33 is moved out to the position shown in FIG. 3, the end 37 of spring 34 snaps under stop surface 50 on slider 33 latching the slider in its second or outer position with idler gear 32 out of engagement. So long as the fine tuning control is not operated, the slider remains in this position. However, when fine tuning drive gear 30 is next turned, cam 51 on the rear face of the turning gear forces latch spring 37 out beyond slider stop surface 50, allowing the slider to return to its first position with the idler gear engaging both the fine tune drive gear 30 and the gear head 25*a* of the selected channel frequency adjustment screw. Subsequent rotation of the fine tuning control acts through the idler gear to modify the position of the tuning screw and thus the selected channel frequency.

The fine tuning shaft 31 and fine tune drive gear 30 turn freely on channel selector shaft 22. Accordingly, when slider 33 is moved from its first position, FIG. 2, to the second position, FIG. 3, and latch spring 37 snaps behind shoulder 50, the spring causes the gear and cam to turn, if necessary, so that the end of the spring is positioned in a valley 51*a* between two adjacent rises 51*b*.

The preferred form of the invention is illustrated in FIGS. 5 through 7. Elements which are substantially the same in structure and function as corresponding elements in FIGS. 1–4 are identified by the same reference numerals in FIGS. 5–7 and will not again be described in detail. The tuner chassis has a front plate 21 with the channel selector shaft 22 extending outwardly therefrom. Fine tune shaft 31 and drive gear 30 are telescoped over the channel selector shaft and rotate freely thereon. Mounted behind the front plate on channel selector shaft 22 are detent plate 26, rotary carrier 23 and the fine tune adjustment screws 25 for each channel.

Idler gear 32 is mounted on a slider 55 which has bearing boss 40 extending through elongated opening 43 in the front plate. An elongated slot 56 in the carrier receives channel selector shaft 22 and permits movement of the slider back and forth on the front plate.

A bellcrank-shaped pawl 56 is pivoted on an extension 57 at the lower end of slider 55. One arm 58 of the pawl extends upwardly along the side of the slider while the other arm 59 extends laterally beneath the slider. Pawl 56 is preferably stamped of metal and has bearing surfaces 60 formed therein and extending rearwardly against the surface of front plate 21. Channel selector shaft bias spring 62 has one end 63 bearing against the selector shaft 22 and received in channel 22*b* to position the shaft longitudinally of the tuner chassis. The other end 64 of spring 62 bears against a tab 65 extending outwardly from pawl arm 59, serving the dual function of urging slider 55 downwardly and rotating pawl 56 in a counterclockwise direction about its pivot on the slider.

In FIGS. 5 and 6, the slider is in its second position with idler gear 32 out of engagement with fine tune drive gear 30 and tuning screw 25. The upper end of pawl arm 58 has a latching projection 58*a* which is engaged with the edge of a stop 68 extending outwardly from front plate 21. A cam follower extension 69 on pawl arm 58 extends outwardly around stop 68 and engages slider release cam 70 on the rear of fine tune drive gear 30. Cam follower 69 is pointed, as best seen in FIGS. 6 and 7, to insure that it is always seated in a valley of cam 70 when the slider is in its second position. Slider 55 is in the position of FIG. 6 during channel selection and until the fine tune shaft 31 is turned. Upon actuation of the fine tune gear 30, cam 70 releases pawl 56 from its stop and bias spring 64 moves slider 55 downwardly to engage idler gear 32. Thereafter manipulation of the fine tune control adjusts the position of tuning screw 25. When channel selector shaft 22 is next turned, detent wheel 26 engages a projection 46 on the rear of slider 55 moving the slider upwardly, disengaging idler gear 32 and permitting pawl 56 to rotate in a counterclockwise direction to engage stop 68.

The use of a latch plate with a pointed follower surface eliminates problems which were encountered in maintaining dimensional tolerance of the latch spring which resulted in the spring hanging up on the cam occasionally.

FIG. 8 shows another embodiment of the invention utilizing a leaf spring latch. Again, elements of the mechanism which are substantially the same in construction and function as those in the embodiment of FIGS. 1–4 will be identified by the same reference numerals and will not be described in detail. Here, slider 75 extends downwardly below fine tune drive gear 30 a sufficient distance for engagement with the end 64 of channel selector shaft bias spring 62, the spring urging the slider downwardly to maintain engagement of idler gear 32 with the drive gear and with tuning screw 25. A U-shaped leaf-type latching spring 76 has a mounting tab 77 on the leg 78, the tab extending through an opening in front plate 21. The other leg 79 of the leaf spring has a rounded latching and cam follower portion 80 which bears against the lateral edge of slider 75, and engages shoulder 81 holding the slider in its second position with the idler gear 32 out of engagement. In this position spring portion 80 is also received in the valley between two rises of release cam 82 on fine tune shaft 31. When the fine tuning control is actuated, the latching portion 80 of leaf spring 76 is forced out beyond shoulder 81 and slider 75 moves downwardly under the influence of spring 62 to engage idler gear 32 with drive gear 30 and tuning member 25. When the channel selector shaft 22 is next rotated, detent wheel 26 engages projection 46 on the rear of slider 75 to move slider 75 upwardly and disengage the idler gear.

I claim:

1. A multichannel tuner including a rotatable channel selector shaft, means actuated by said shaft for tuning circuits to a selected one of a plurality of frequency channels, including a fine tuning member for each channel, rotatably mounted on a carrier secured to said shaft, said fine tuning members being located generally in a circle about said selector shaft and each having a gear portion formed thereon, a fine tuning member adjustment means comprising:

a fine tuning control rotatable on said shaft and having a drive gear thereon;

an idler gear connected between said fine tuning control drive gear and the gear portion of the fine tuning member for the selected channel;

movable mounting means for said idler gear having a first position with the idler in engagement and a second position with the idler out of engagement;

means urging said idler gear mounting means toward said first position; and means responsive to rotation of said channel selector shaft for moving said mounting means to said second position to avoid engagement of said idler gear with said fine tuning members during channel selection.

2. The tuner of claim 1 including means for latching said mounting means in said second position.

3. The tuner of claim 2 including means for releasing said latching means.

4. The tuner of claim 2 including means responsive to rotation of said fine tuning control for releasing said latching means.

5. The tuner of claim 4 wherein said latching means is a spring latch.

6. The tuner of claim 5 in which the tuner has a chassis, said idler gear mounting means is a carrier plate slidable on said chassis, and said spring latch is mounted on said chassis and has a latching end portion bearing against an edge of said carrier plate, said carrier plate having a stop surface engageable with said spring latch end portion when said carrier is in the second position, and a cam on the fine tuning control operable with the fine tuning control to engage the latch spring and release it from said stop.

7. The tuner of claim 6 in which said spring latch is a leaf spring.

8. The tuner of claim 4, said means for releasing said latching means including a cam on said rotatable fine tuning control and a pointed cam follower on said latching means, engaging the cam for release of the latch upon rotation of the fine tuning control.

9. The tuner of claim 8 in which said cam is generally circular and has a plurality of rises and valleys.

10. The tuner of claim 2 wherein said means urging said idler gear mounting means includes a spring with one end urging said mounting means toward said first position and another end providing said latch means.

11. The tuner of claim 2 having a chassis, said mounting means being slidable thereon, a latch member pivoted on said mounting means and a stop on said chassis, said latch engaging said stop to hold said mounting means in said second position.

12. The tuner of claim 11, said means urging said idler gear mounting means including a spring having one end fixed with respect to said chassis and the other end engaging said latch, urging said mounting means toward said first position and said latch toward said stop.

13. The tuner of claim 12 in which said chassis has a front plate, said selector shaft extends through an opening in the front plate, and said spring has one end bearing against the shaft, holding it against the edge of said opening and the other end urging the mounting means to said first position.

14. The tuner of claim 11 in which said chassis has a front plate and said idler gear mounting means is a carrier plate slidable thereon, said latch member being pivoted on the mounting means, adjacent with said front plate and having plural bearing surfaces engaging the front plate.

15. The tuner of claim 1 having a chassis with a front plate, said idler gear mounting means is a carrier plate slidable on said front plate.

16. The tuner of claim 15 wherein said latching means is a spring latch mounted on said front plate and engageable with a stop on said carrier plate.

17. The tuner of claim 15 in which said selector shaft extends through an opening in said front plate, and said means urging said idler gear mounting means includes a bias spring with one end bearing against said shaft, holding the shaft against the edge of said opening and the other end urging the carrier plate to said first position.

18. The tuner of claim 15 including a leaf spring latch mounted on said front plate and having an end surface engaging said carrier plate for latching the plate in said second position.

19. The tuner of claim 1 having a channel selection detent mechanism including a disc with a toothed periphery on said shaft, the teeth corresponding with the selectable channels, and a boss on said movable mounting means extending into the path of movement of said teeth, for movement of the mounting means to the second position upon rotation of the channel selector shaft.

20. The tuner of claim 1 wherein said means urging said idler gear mounting means toward said first position includes a spring.

21. The tuner of claim 20 including cam means on said channel selector shaft for moving said idler gear mounting means to said second position.

* * * * *